(12) United States Patent
Lee

(10) Patent No.: US 7,642,890 B2
(45) Date of Patent: Jan. 5, 2010

(54) INDUCTOR STRUCTURE

(75) Inventor: Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/742,388

(22) Filed: Apr. 30, 2007

(65) Prior Publication Data

US 2008/0191829 A1    Aug. 14, 2008

(30) Foreign Application Priority Data

Feb. 13, 2007    (TW) ............................. 96105237 A

(51) Int. Cl.
*H01F 5/00*    (2006.01)
(52) U.S. Cl. ................................................... 336/200
(58) Field of Classification Search ............ 336/65, 336/83, 200, 232, 180–186, 225; 257/531
See application file for complete search history.

(56) References Cited

U.S. PATENT DOCUMENTS

| | | | |
|---|---|---|---|
| 5,831,331 A | 11/1998 | Lee | |
| 6,480,086 B1 * | 11/2002 | Kluge et al. | 336/200 |
| 6,927,662 B2 * | 8/2005 | Kahlmann et al. | 336/200 |
| 7,317,354 B2 * | 1/2008 | Lee | 330/200 |
| 7,370,403 B1 * | 5/2008 | Hsu et al. | 29/602.1 |
| 7,382,222 B1 * | 6/2008 | Manetakis | 336/200 |
| 2004/0056749 A1 * | 3/2004 | Kahlmann et al. | 336/200 |
| 2004/0100349 A1 * | 5/2004 | Mheen et al. | 336/223 |
| 2004/0140528 A1 * | 7/2004 | Kim et al. | 257/537 |

* cited by examiner

Primary Examiner—Tuyen T. Nguyen
(74) Attorney, Agent, or Firm—J.C. Patents

(57) ABSTRACT

An inductor structure including a first winding turn and a second winding turn is provided. The first winding turn is disposed above a substrate. The second winding turn is disposed between the first winding turn and the substrate. One end of the second winding turn is grounded, and the other end of the second winding turn and the first winding turn are electrically connected in series. The first winding turn and the second winding turn form a three-dimensional helix structure above the substrate. The width of the second winding turn is greater than that of the first winding turn, and furthermore, the first winding turn is projected onto the second winding turn.

12 Claims, 8 Drawing Sheets

INDUCTOR STRUCTURE

CROSS-REFERENCE TO RELATED APPLICATION

This application claims the priority benefit of Taiwan application serial no. 96105237, filed Feb. 13, 2007. All disclosure of the Taiwan application is incorporated herein by reference.

BACKGROUND OF THE INVENTION

1. Field of the Invention

The present invention generally relates to an inductor structure, and more particularly, to an inductor having a three-dimensional helix structure.

2. Description of Related Art

In general, an inductor functions as a device for saving and releasing energy through the inter-conversion between electrical and magnetic fields. Therefore, an inductor can serve as a current-stabilizing device. In integrated circuits, inductors are important but challenging passive devices. In addition, the range of application of the inductors is very wide. For example, inductors are often used in radio frequency circuits. The performance of an inductor is based on its quality factor represented by a Q value. The higher the Q value of the inductor, the better the quality of the inductor is. The Q value is defined by the following formula: $Q=\omega \times L/R$, wherein $\omega$ is the angular frequency, L is the inductance of the winding, and R is the resistance when the inductor loss is considered within a designated frequency range. According to the above formula, the Q value is inversely proportional to the resistance. In other words, the Q value will increase by lowering of the resistance. Yet, the resistance is directly proportional to the square of the current density. Therefore, a method of increasing the Q value is to increase the section area of the metal winding so as to reduce the resistance. In other words, the resistance of the metal winding is reduced to minimize conductor loss and achieve the goal of increasing the Q value.

At present, a number of methods and techniques have been developed to integrate the process of fabricating inductors and integrated circuits. However, in an integrated circuit, the limitation of inductor metal thickness and the interference of the inductor by the silicon substrate will lead to a lower quality inductor. The conventional technique of disposing a thicker metal on the uppermost inductor structure to increase the section area of the inductor metal and lower the conductor loss is used to increase the Q value of the inductor. However, when the thickness of the metal is increased up to a certain level, the improvements in conductor loss and Q value become less prominent. Therefore, how to resolve the foregoing problems, increase the Q value and reduce the conductor loss is high on the developing list.

SUMMARY OF THE INVENTION

Accordingly, the present invention is directed to an inductor structure that can reduce inductor loss and improve the Q value and quality of the inductor.

According to an embodiment of the present invention, an inductor structure including a first winding turn and a second winding turn is provided. The first winding turn is disposed above a substrate. The second winding turn is disposed between the first winding turn and the substrate. One end of the second winding turn is grounded, and the other end of the second winding turn and the first winding turn are electrically connected in series. The first winding turn and the second winding turn form a three-dimensional helix structure above the substrate. The width of the second winding turn is greater than that of the first winding turn, and furthermore, the first winding turn is projected onto the second winding turn.

According to another embodiment of the present invention, an inductor structure including a first winding turn, a second winding turn and a third winding turn is provided. The first winding turn is disposed above a substrate. The second winding turn is disposed between the first winding turn and the substrate. One end of the second winding turn is grounded. The width of the second winding turn is greater than that of the first winding turn, and furthermore, the first winding turn is projected onto the second winding turn. The third winding turn is disposed between the first winding turn and the second winding turn. The third winding turn forms a three-dimensional winding turn structure having at least one turn above the substrate, and furthermore, the third winding turn is projected onto the second winding turn. The first winding turn and the second winding turn are electrically connected in series through the third winding turn. The first winding turn, the second winding turn and the third winding turn form a three-dimensional helix structure above the substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
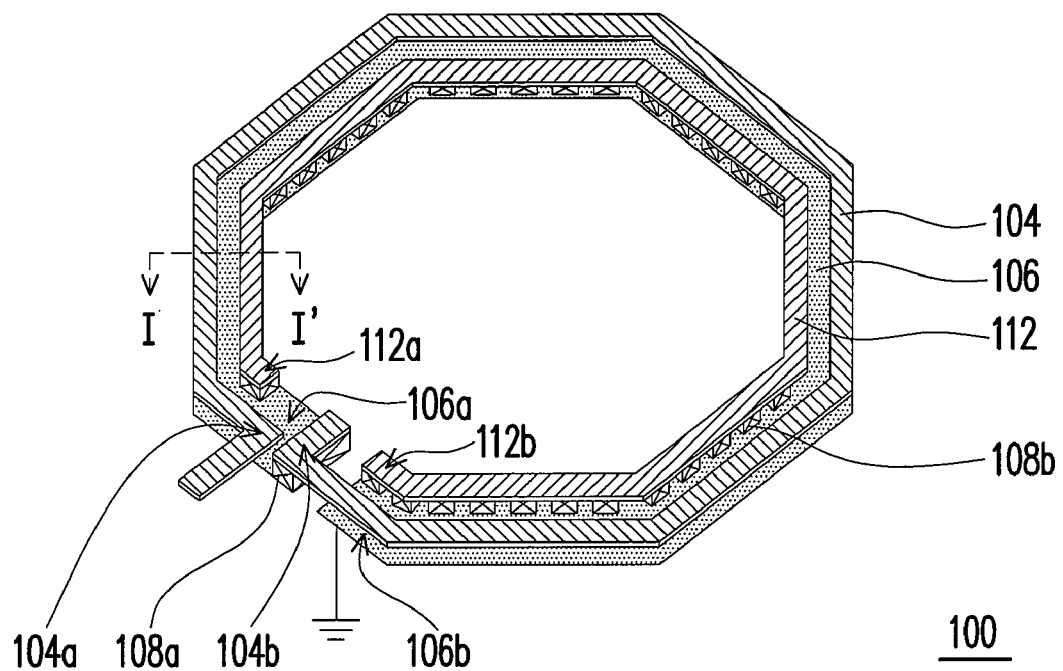
FIG. 1A is a perspective view of an inductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
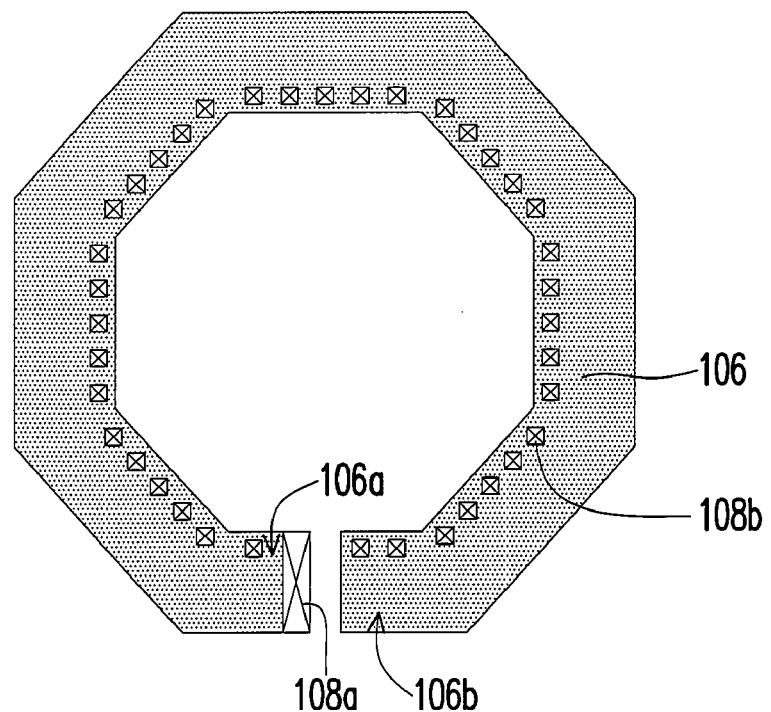
FIG. 1B is a top view of the winding turn 106 according to an embodiment of the present invention.
Figure 1C:
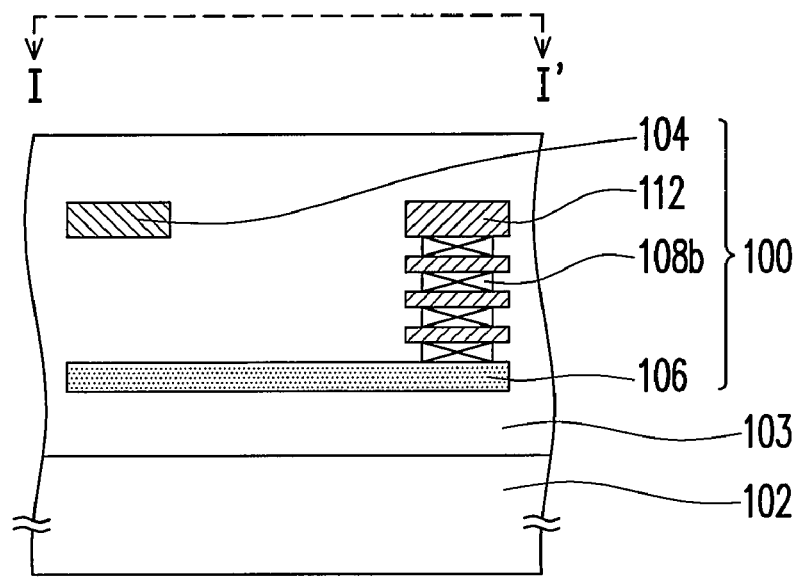
FIG. 1C is a schematic cross-sectional view along line I-I' of the inductor structure of FIG. 1A.

FIG. 1A is a perspective view of an inductor structure according to an embodiment of the present invention. FIG. 1B is a top view of the winding turn 106 according to an embodiment of the present invention. FIG. 1C is a schematic cross-sectional view along line I-I' of the inductor structure of FIG. 1A.

First, as shown in FIGS. 1A, 1B and 1C, the inductor 100 includes at least one winding turn 104 and one winding turn 106. The winding turn 104 is disposed in a dielectric layer 103 above the substrate 102. The inductor 100 can be fabricated by using a semiconductor process. Therefore, the substrate 102 can be a silicon substrate and the material of the dielectric layer 103 can be silicon oxide or other dielectric material, for example. The material of the winding turns 104 and 106 can be a metal, for example, copper or aluminium/copper alloy. The winding turn 104 has a first end 104a and a second end 104b. The first end 104a is coupled to an operating voltage (not shown), for example. The winding turn 106 is disposed in the dielectric layer 103 between the winding turn 104 and the substrate 102 and has a third end 106a and a fourth end 106b. The fourth end 106b is grounded. The third end 106a of the winding turn 106 and the winding turn 104 are electrically connected in series, for example, by connecting the second end 104b of the winding turn 104 and the third end 106a of the winding turn 106 through a via 108a. The winding turns 104 and 106 form a three-dimensional helix structure above the substrate 102. The width of the winding turn 106 is greater than that of the winding turn 104, for example. The winding turn 104 is projected onto the winding turn 106.

It should be noted that the inductor 100 is grounded through the fourth end 106b of the winding turn 106, which is closest to the substrate 102. Because the electric field there is the smallest, parasitic capacitance between the substrate 102 and the inductor 100 is smaller to improve the quality of the inductor 100.

As shown in FIG. 1C, the inductor 100 of the present embodiment can also include at least one gain wire 112. The gain wire 112 has a fifth end 112a and a sixth end 112b and is disposed on the inner side of the three-dimensional helix structure. The gain wire 112 is projected onto the winding turn 106, for example. The gain wire 112 is coupled to the inner side of the winding turn 106, for example. The method includes electrically connecting the fifth end 112a and the sixth end 112b of the gain wire 112 to the third end 106a and the fourth end 106b of the winding turn 106 in parallel through at least two vias 108b. In the present embodiment, the gain wire 112 and the winding turn 106 are electrically coupled through a plurality of vias 108b. In addition, when several gain wires 112 (four are drawn in the present embodiment) are used, the two gain wires 112 which are upper and lower neighboring are coupled in parallel through a plurality of vias 108b, for example. The material of the gain wire 112 can be a metal, for example, copper or aluminium/copper alloy.

In addition, the inductor 100 of the present embodiment has an octagonal winding turn disposition. However, the inductor of the present invention is not intended to be limited to the method of disposition outlined in the present embodiment. Those skilled in the art may modify the method as required.

Figure 2A:
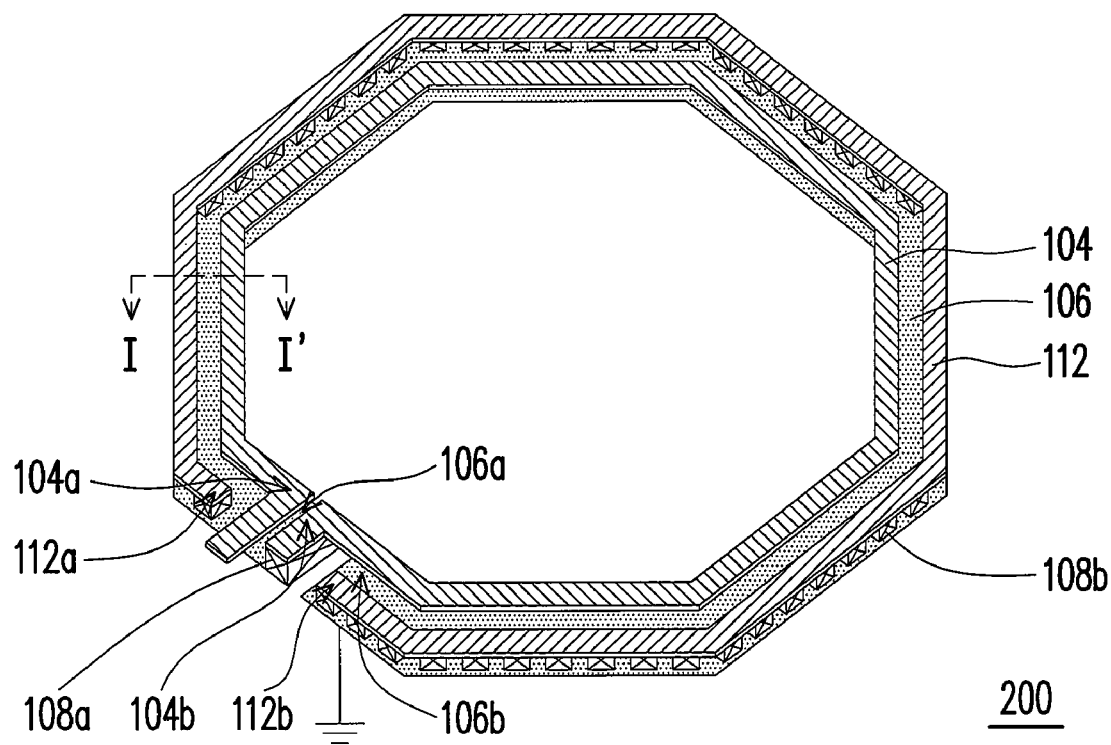
FIG. 2A is a perspective view of an inductor structure according to another embodiment of the present invention.
Figure 2B:
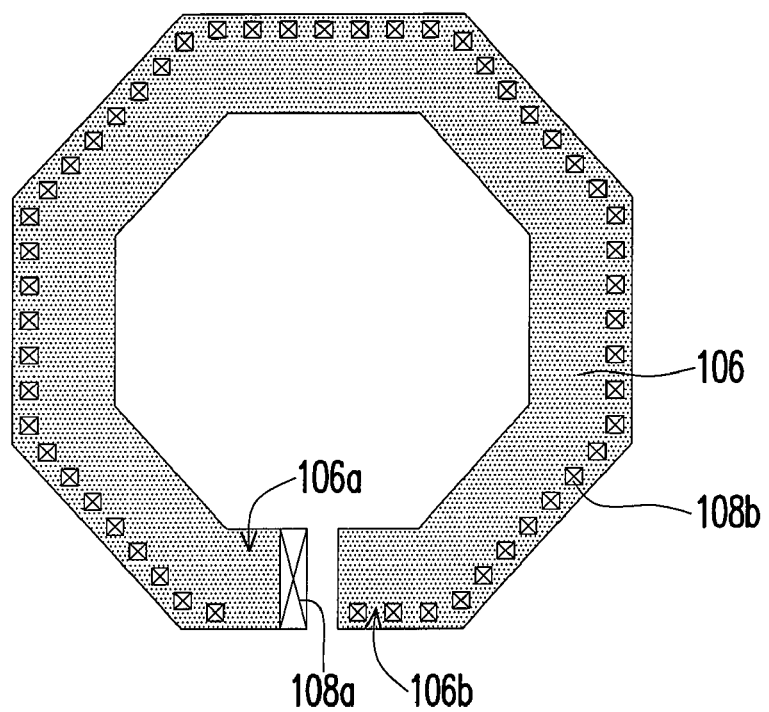
FIG. 2B is a top view of the winding turn 106 according to another embodiment of the present invention.
Figure 2C:
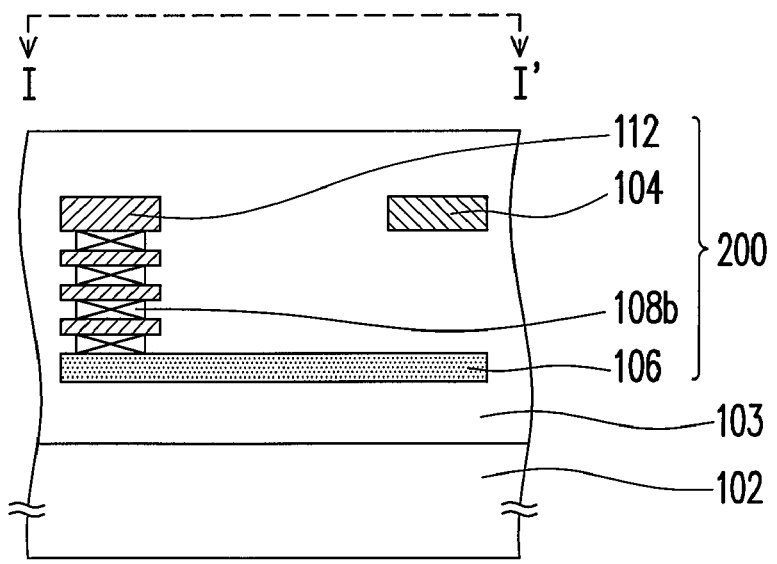
FIG. 2C is a schematic cross-sectional view along line I-I' of the inductor structure of FIG. 2A.

FIG. 2A is a perspective view of an inductor structure according to another embodiment of the present invention. FIG. 2B is a top view of the winding turn 106 according to another embodiment of the present invention. FIG. 2C is a schematic cross-sectional view along line I-I' of the inductor structure of FIG. 2A. Components in FIGS. 2A to 2C identical to the ones in FIGS. 1A to 1C are labelled identically and a full description of the components is omitted.

The present invention also provides another inductor structure. As shown in FIGS. 2A, 2B and 2C, the inductor 200 is disposed in the dielectric layer 103 above the substrate 102. In another embodiment, the components forming the inductor 200 and the components forming the inductor 100 are identical. The main difference is that the gain wire 112 of the inductor 200 having a fifth end 112a and a sixth end 112b is disposed on the outer side of the three-dimensional helix structure. The gain wire 112 is projected onto the winding turn 106, for example. In addition, the gain wire 112 is coupled to the outer side of the winding turn 106. Furthermore, the method of coupling includes electrically connecting the gain wire 112 and the winding turn 106 in parallel through a plurality of vias 108b, for example.

Figure 3A:
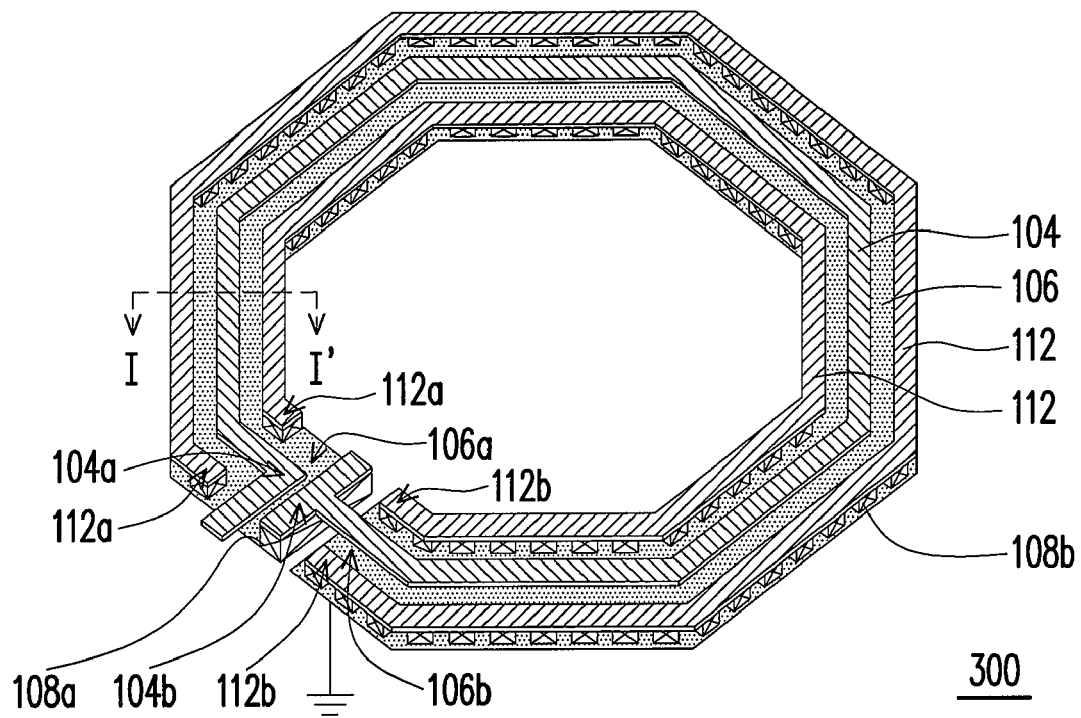
FIG. 3A is a perspective view of an inductor structure according to yet another embodiment of the present invention.
Figure 3B:
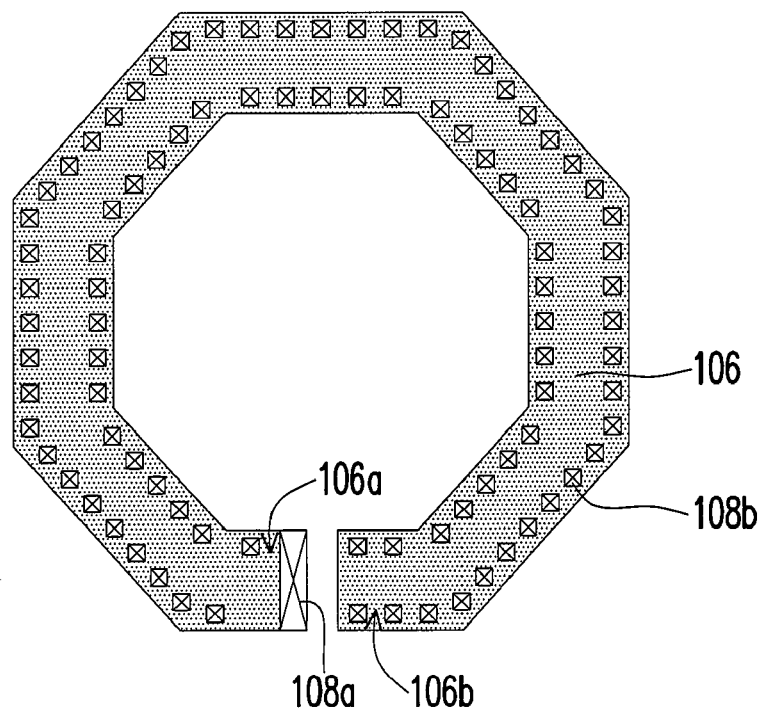
FIG. 3B is a top view of the winding turn 106 according to yet another embodiment of the present invention.
Figure 3C:
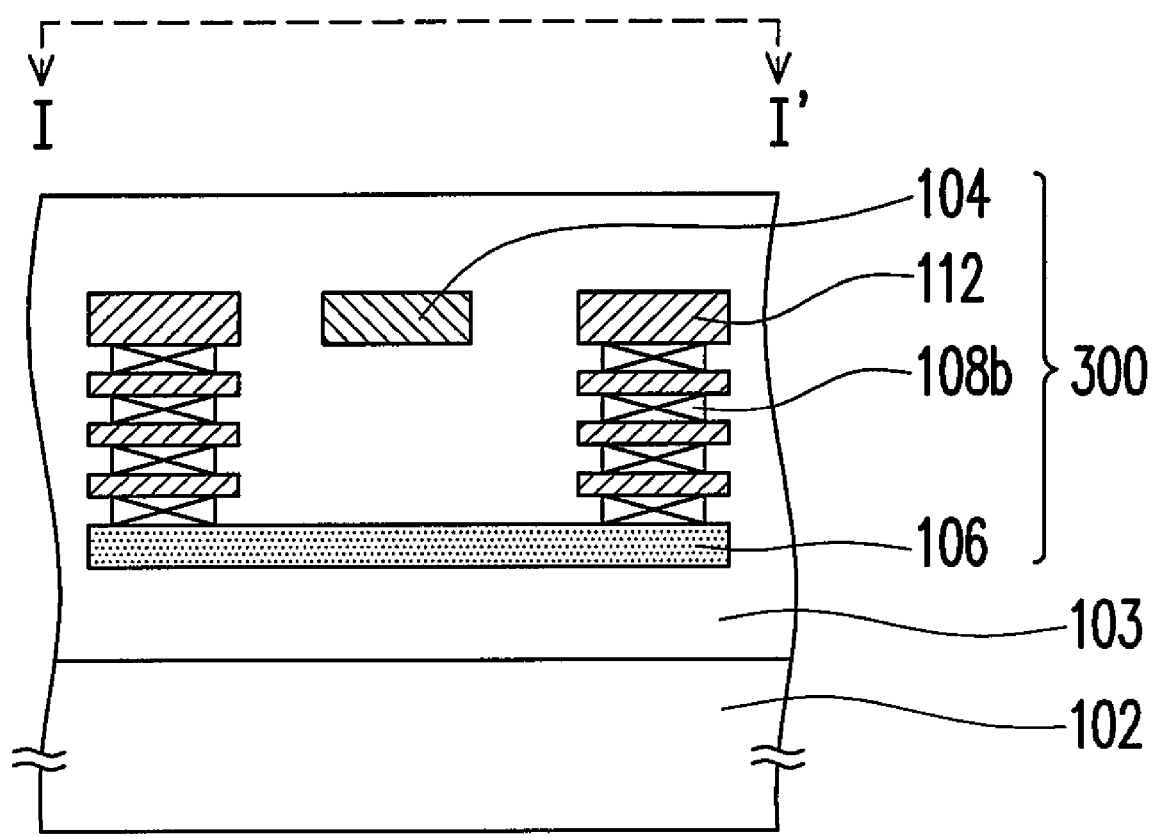
FIG. 3C is a schematic cross-sectional view along line I-I' of the inductor structure of FIG. 3A.

FIG. 3A is a perspective view of an inductor structure according to yet another embodiment of the present invention. FIG. 3B is a top view of the winding turn 106 according to yet another embodiment of the present invention. FIG. 3C is a schematic cross-sectional view along line I-I' of the inductor structure of FIG. 3A. Components in FIGS. 3A to 3C identical to the ones in FIGS. 1A to 1C are labelled identically and a fall description of the components is omitted.

The present invention also provides another inductor structure. As shown in FIGS. 3A, 3B and 3C, the inductor 300 is disposed in the dielectric layer 103 above the substrate 102, for example. In another embodiment, the components forming the inductor 300 and the components forming the inductor 100 are identical. However, in the inductor 300, two gain wires 112 each having a fifth end 112a and a sixth end 112b are simultaneously disposed on the inner side and the outer side of the three-dimensional helix structure. The gain wires 112 located on the inner side and the outer side of the three-dimensional helix structure are both projected onto the winding turn 106. Furthermore, the gain wires 112 are coupled to the inner and outer sides of the winding turn 106 respectively. The method of coupling includes electrically connecting the gain wires 112 and the winding turn 106 in parallel through a plurality of vias 108b, for example.

Because the inductors 100, 200 and 300 have a winding turn 106 with a greater width and a gain wire 112 coupled in parallel to at least one side of the winding turn 106, the cross section areas of the inductors 100, 200 and 300 are increased. As a result, conductor loss is reduced. In addition, although the cross section areas of the inductors 100, 200 and 300 are increased, the inductors 100, 200 and 300 are grounded through the fourth end 106b of the winding turn 106, which is closest to the substrate 102. Since the winding turn 106 closest to the substrate 102 has the lowest electric field, parasitic capacitance between the substrate 102 and the metal is smaller. Therefore, the inductors 100, 200 and 300 can have a better quality.

Figure 4A:
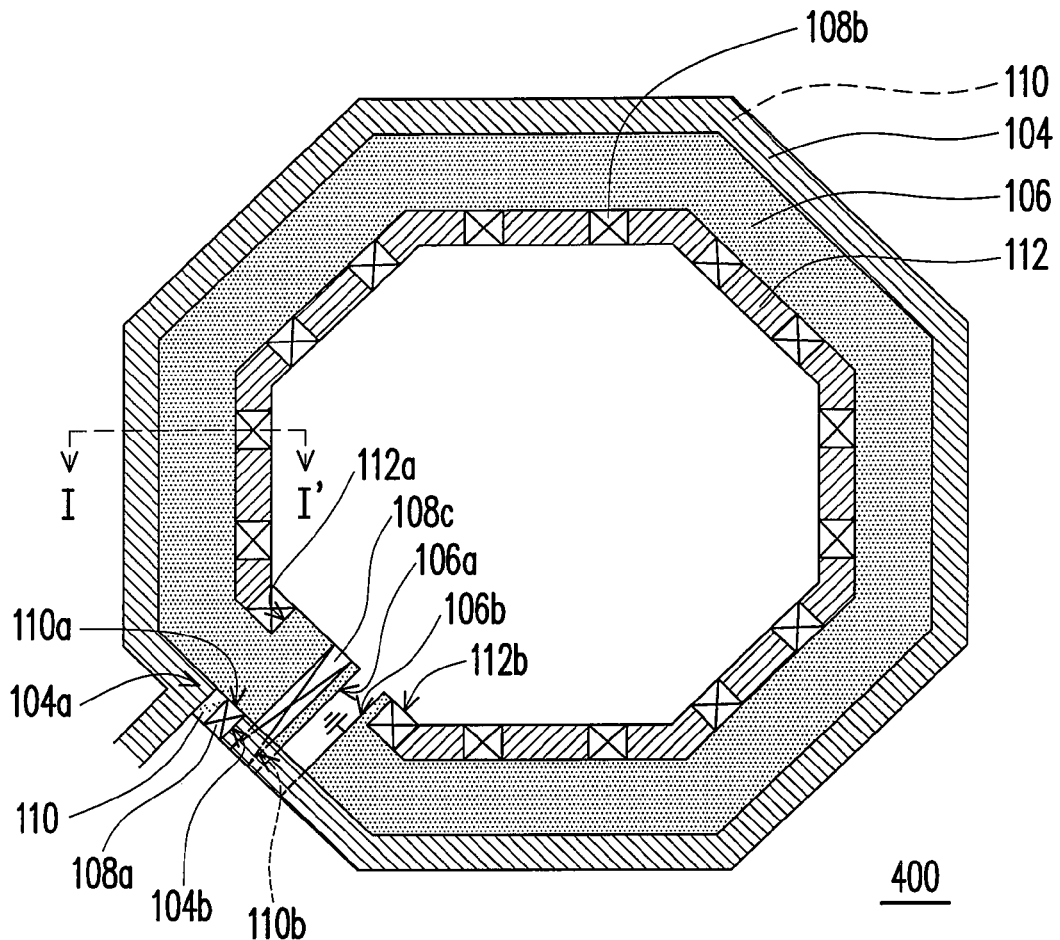
FIG. 4A is a top view of an inductor structure according to another embodiment of the present invention.
Figure 4B:
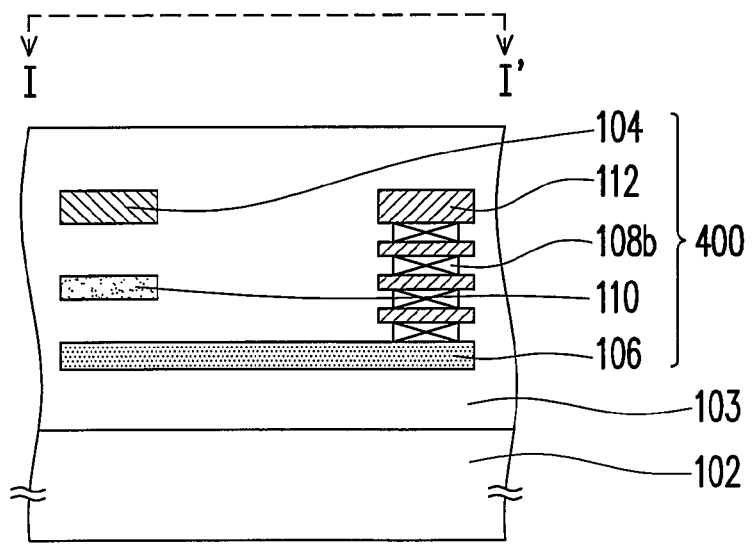
FIG. 4B is a schematic cross-sectional view along line I-I' of the inductor structure of FIG. 4A.

FIG. 4A is a top view of an inductor structure according to another embodiment of the present invention. FIG. 4B is a schematic cross-sectional view along line I-I' of the inductor structure of FIG. 4A. Components in FIGS. 4A and 4B identical to the ones in FIGS. 1A to 1C are labelled identically and a full description of the components is omitted.

The present invention also provides another inductor structure. As shown in FIGS. 4A and 4B, the inductor 400 is disposed in the dielectric layer 103 above the substrate 102. In another embodiment, the components forming the inductor 400 and the components forming the inductor 100 are identical. The main difference is that the inductor 400 further includes a winding turn 110. The winding turn 110 is disposed in the dielectric layer 103 between the winding turns 104 and 106, for example. Furthermore, the winding turn 110 is projected onto the winding turn 106. The winding turn 110 has a seventh end 110a and an eighth end 110b. The seventh end 110a is coupled to the second end 104b of the winding turn 104 through a via 108a while the eighth end 110b is coupled to the third end 106a of the winding turn 106 through a via 108c. Therefore, the winding turns 104 and 106 are electrically connected in series through the winding turn 110. Furthermore, the winding turns 104, 110 and 106 form a three-dimensional helix structure above the substrate 102. In addition, the material of the winding turn 110 can be a metal, for example, copper or aluminium/copper alloy.

Figure 5A:
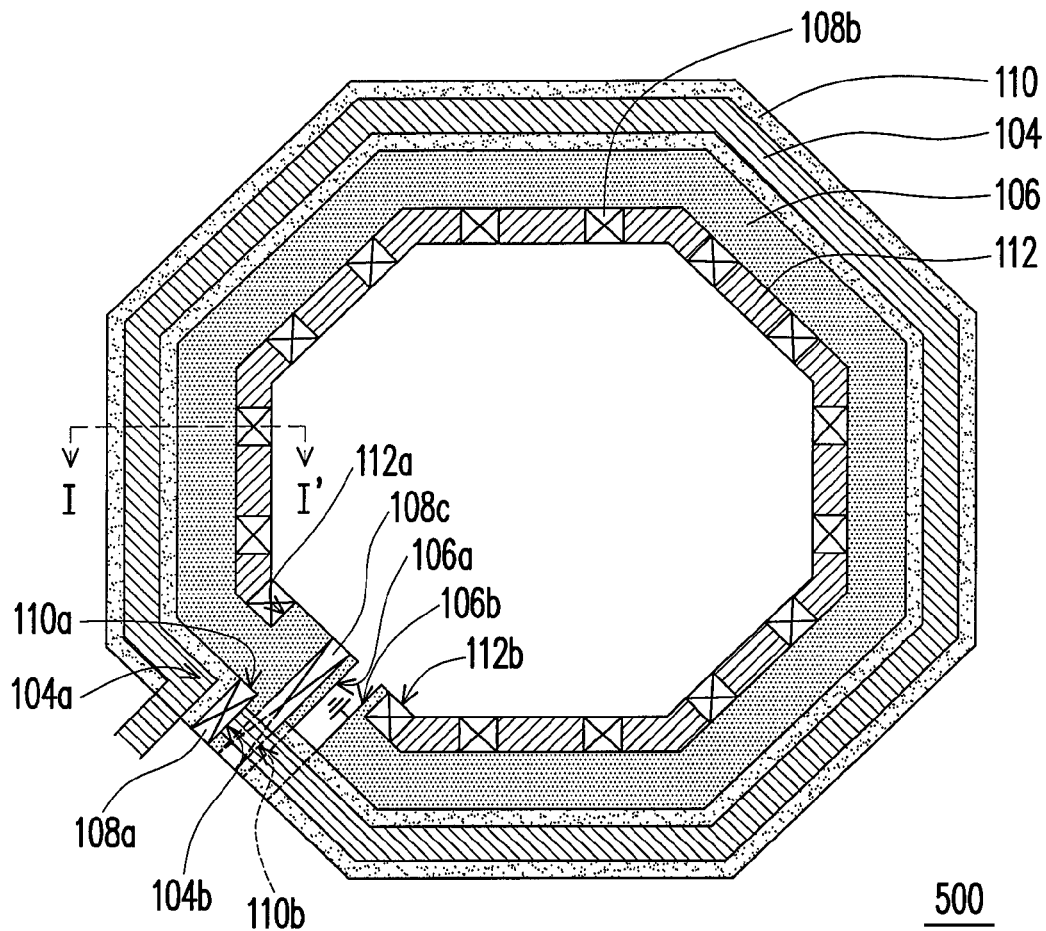
FIG. 5A is a top view of an inductor structure according to another embodiment of the present invention.
Figure 5B:
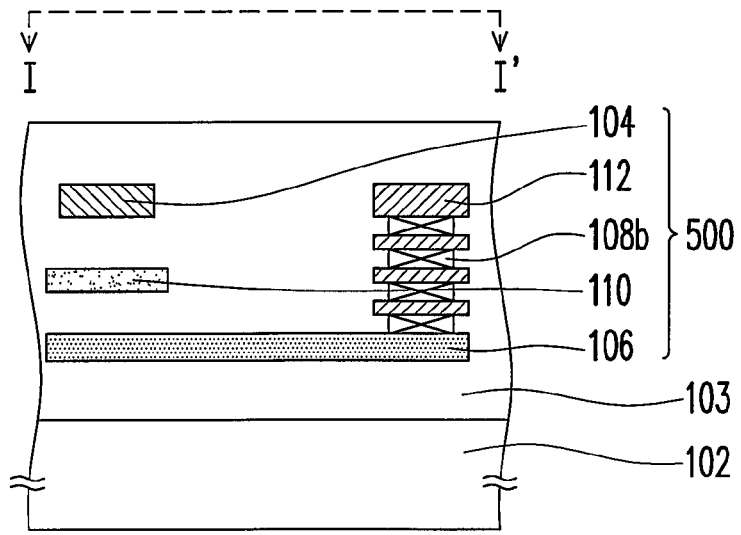
FIG. 5B is a schematic cross-sectional view along line I-I' of the inductor structure of FIG. 5A.

It should be noted that the width of the winding turn 110 and that of the winding turn 104 are identical in the present embodiment. However, in other embodiment, the width of the winding turn 110 can be greater than the width of the winding turn 104. Moreover, the width of the winding turn 106 can be greater than the width of the winding turn 110 (as shown in FIGS. 5A and 5B). In other words, the inductor 500 has a three-dimensional helix structure with multiple turns. Furthermore, the width of each turn of the winding turns increases gradually toward the substrate 102. In this way, the quality of the inductor can be improved.

In the two aforementioned embodiments (FIGS. 4A, 4B, 5A and SB), the winding turn 110 of the three-dimensional winding turn structure has only a single turn. However, this is not intended to limit the scope of the present invention. Those skilled in the art may vary the number of turns in the winding turn 110 according to the actual requirements so as to form a multiple turn three-dimensional winding turn structure of the winding turn 110. Furthermore, the width of the winding turn 110 can be greater than or equal to the width of the winding turn 104. In addition, in the two aforementioned embodiments (FIGS. 4A, 4B, 5A and SB), the gain wire 112 is disposed on the inner side of the three-dimensional helix structure. However, this arrangement is not intended to limit the scope of the present invention. Those skilled in the art can dispose the gain wire 112 on the outer side or simultaneously on both the inner side and the outer side of the three-dimensional helix structure.

Figure 6:
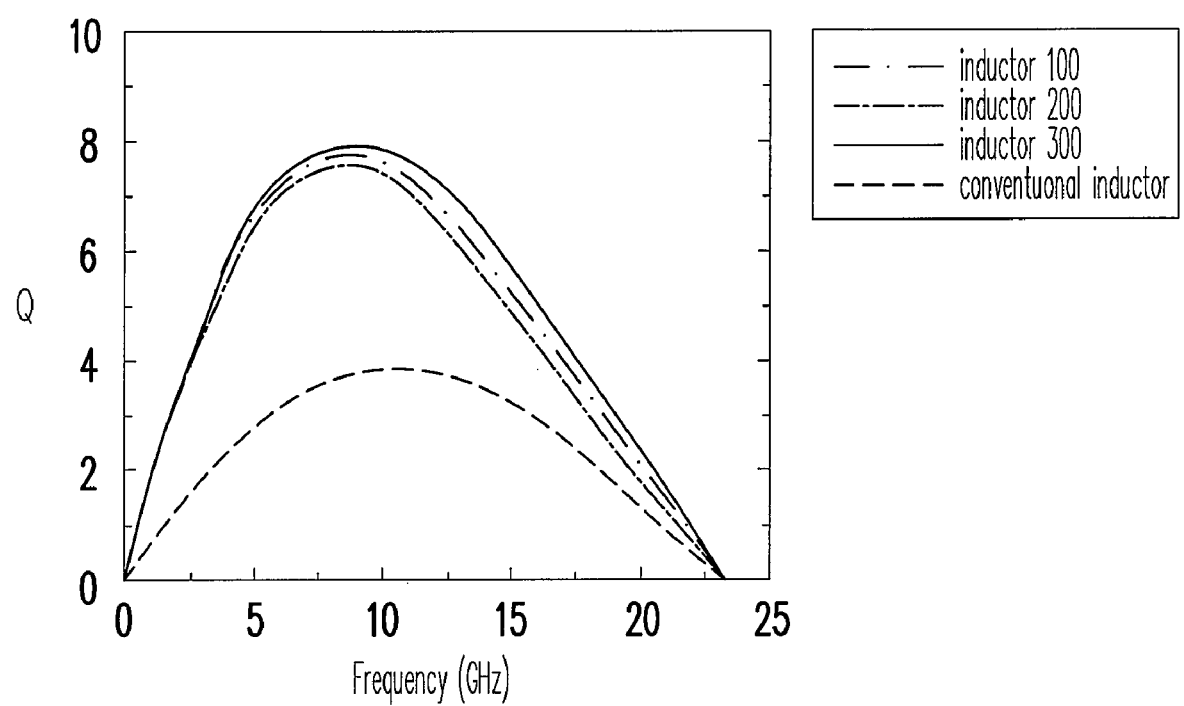
FIG. 6 is a graph with curves for comparing the Q values between the inductor structure of the present invention and that of the conventional inductor structure.

FIG. 6 is a graph with curves for comparing the Q values between the inductor structure of the present invention and that of the conventional inductor structure.

As shown in FIG. 6, actual test results shows that the inductors 100, 200 and 300 in the present invention have higher Q values than the conventional inductor within the frequency range 0~25 GHz. Therefore, regardless of whether operating in the low frequency or high frequency range, the present invention is able to substantially improve the quality of the inductor. Moreover, the inductor 300 has gain wires 112 simultaneously disposed on the inner side and outer side of the three-dimensional helix structure. In other words, the inductor 300 has a greater cross section area than the inductors 100 and 200. As a result, the Q value of the inductor 300 is higher than the Q values of the inductors 100 and 200.

In summary, the inductor structure of the present invention has a three-dimensional helix structure. Since the width of the winding turns closer to the bottom of the three-dimensional helix structure is greater, the consequent increase in the cross section area can reduce the conductor loss.

Moreover, an additional winding turn 110 can be electrically connected in series between the winding turns 104 and 106 of the three-dimensional helix structure to increase the cross section area of the inductor. As a result, conductor loss is lowered and parasitic capacitance between metals is reduced so that the performance of the inductor is enhanced.

Although increasing the cross section area increases the parasitic capacitance between the substrate and the metal, the inductor structure of the present invention is grounded through the winding turn closest to the substrate. Because a winding turn with a greater width produces a lower electric field, the parasitic capacitance between the substrate and the metal is almost not increased and the Q value of the inductor is not impacted.

On the other hand, a gain wire can be disposed on at least one side (the inner side, the outer side or both) of the three-dimensional helix structure and electrically connected to the winding turn 106 in parallel. Therefore, the cross section area of the inductor structure is further increased to reduce conductor loss so that the inductor can have a higher quality.

In addition, the applicable frequency range of the inductor of the present invention can be kept within the radio frequency range and the fabrication process of the inductor can be integrated with an existing process to minimize production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor structure, comprising:
a first winding turn, disposed on a substrate;
a second winding turn, disposed between the first winding turn and the substrate, wherein a cross section area of the second winding turn is greater than that of the first winding turn, and the first winding turn is projected on to the second winding turn; and
a third winding turn, disposed between the first winding turn and the second winding turn, the third winding turn forms a three-dimensional winding turn structure having at least one turn above the substrate, and the third winding turn is projected onto the second winding turn, one end of the second winding turn is grounded, and the other end of the second winding turn and the three winding turn are electrically connected in series, the first winding turn and the second winding turn are electrically connected in series through the third winding turn, and the first winding turn, the second winding turn and the third winding turn form a three-dimensional helix structure above the substrate.

2. The inductor structure according to claim 1, wherein a material of the first winding turn comprises metal.

3. The inductor structure according to claim 1, wherein a material of the second winding turn comprises metal.

4. The inductor structure according to claim 1, wherein a width of the third winding turn is greater than that of the first winding turn, and a width of the second winding turn is greater than that of the third winding turn.

5. The inductor structure according to claim 4, wherein the third winding turn form a three-dimensional winding turn structure with a plurality of turns above the substrate, and a width of each turn of the third winding turn increases toward the substrate, and furthermore, a width of the winding turn of the three-dimensional winding turn structure furthest from the substrate is greater than that of the first winding turn, and the width of the second winding turn is greater than that of the winding turn of the three-dimensional winding turn structure closest to the substrate.

6. The inductor structure according to claim 1, further comprising at least one first gain wire disposed on an inner side of the three-dimensional helix structure, the first gain wire and the second winding turn are electrically connected in parallel, and the first gain wire is projected onto the second winding turn.

7. The inductor structure according to claim 6, further comprising at least two vias for coupling two ends of the first gain wire to the second winding turn.

8. The inductor structure according to claim 6, further comprising at least one second gain wire disposed on an outer side of the three-dimensional helix structure, the second gain wire and the second winding turn are electrically connected in parallel, and the second gain wire is projected onto the second winding turn.

9. The inductor structure according to claim 8, further comprising at least two vias for coupling two ends of the second gain wire to the second winding turn.

10. The inductor structure of claim 1, further comprising at least one gain wire disposed on an outer side of the three-dimensional helix structure, the gain wire and the second winding turn are electrically connected in parallel, and the gain wire is projected onto the second winding turn.

11. The inductor structure according to claim 10, further comprising at least two vias for coupling two ends of the gain wire to the second winding turn.

12. The inductor structure according to claim 1, a material of the first winding turn, the second winding turn and the third winding turn comprises metal.

* * * * *